(12) United States Patent
Mauder et al.

(10) Patent No.: US 8,674,727 B2
(45) Date of Patent: Mar. 18, 2014

(54) CIRCUIT AND METHOD FOR DRIVING A TRANSISTOR COMPONENT BASED ON A LOAD CONDITION

(75) Inventors: Anton Mauder, Kolbermoor (DE); Franz Hirler, Isen (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 242 days.

(21) Appl. No.: 12/873,146

(22) Filed: Aug. 31, 2010

(65) Prior Publication Data

US 2012/0049898 A1 Mar. 1, 2012

(51) Int. Cl.
*H03K 3/00* (2006.01)

(52) U.S. Cl.
USPC .......................................... 327/108; 361/91.2

(58) Field of Classification Search
USPC .......................................... 327/108; 361/91.2
See application file for complete search history.

(56) References Cited

U.S. PATENT DOCUMENTS

| 5,396,117 | A | * | 3/1995 | Housen et al. | 327/480 |
| 5,459,339 | A | * | 10/1995 | Sakurai et al. | 257/167 |
| 5,616,945 | A | | 4/1997 | Williams | |
| 5,912,552 | A | * | 6/1999 | Tateishi | 323/285 |
| 6,269,011 | B1 | * | 7/2001 | Ohshima | 363/50 |
| 6,804,096 | B2 | * | 10/2004 | Nagata | 361/78 |
| 7,298,122 | B2 | * | 11/2007 | Bernacchia et al. | 323/282 |
| 8,222,928 | B2 | * | 7/2012 | Bayerer | 327/108 |
| 8,247,874 | B2 | | 8/2012 | Hirler et al. | |

FOREIGN PATENT DOCUMENTS

DE 10 2009 022 032 A1 4/2010
JP 2-134014 A 5/1990

* cited by examiner

*Primary Examiner* — Kenneth B. Wells
(74) *Attorney, Agent, or Firm* — Slater & Matsil, L.L.P.

(57) ABSTRACT

A circuit arrangement includes a transistor component with a gate terminal, a control terminal, and a load path between a source and a drain terminal. A drive circuit is connected to the control terminal and configured to determine a load condition of the transistor component, to provide a drive potential to the control terminal, and to adjust the drive potential dependent on the load condition.

39 Claims, 6 Drawing Sheets

US 8,674,727 B2

CIRCUIT AND METHOD FOR DRIVING A TRANSISTOR COMPONENT BASED ON A LOAD CONDITION

TECHNICAL FIELD

Embodiments of the present invention relate to a circuit arrangement with an adjustable transistor component, in particular, a transistor component with a gate terminal and a further control terminal, and to a method for driving a transistor component.

BACKGROUND

Transistor components, such as MOSFETs, are widely used as electronic switches in the industrial and automotive area. MOSFETs can be operated at high switching frequencies and compared to relays, have a small size.

However, losses occur when a MOSFET is operated. These losses mainly include ohmic losses and capacitive losses and occur as discussed now.

Although MOSFETs can be operated at high switching frequencies, they do not switch on or off abruptly, but they gradually change between an on-state, in which an ohmic resistance of the MOSFET assumes its minimum value, and an off-state, in which the MOSFET blocks and prevents a current flow. The minimum value of the ohmic resistance of an MOSFET is also known as on-resistance. Ohmic losses occur when the MOSFET is in its on-state and are due to the MOSFETs on-resistance. When the MOSFET changes its operation state from the on-state to the off-state, or vice versa, switching losses occur additionally during these transition phases. In many applications, the switching losses dominate the total MOSFET losses at low load currents.

Further, a MOSFET includes a voltage dependent output capacitance (usually referred to as $C_{OSS}$) which usually includes a drain-source capacitance $C_{DS}$ between its drain and source terminals and a gate-drain capacitance $C_{GD}$ between its gate and drain terminals. When the MOSFET transitions from the on-state to the off-state, the output capacitance is charged, i.e., energy is stored in the output capacitance; the output capacitance is discharged, when the MOSFET transitions from the off-state to the on-state. The output energy $E_{OSS}$, which is the energy stored in the output capacitance, is mainly dependent on the voltage across the drain-source path when the MOSFET is in its off-state and is dependent on the capacitance value of the output capacitance. The energy stored in the output capacitance defines the capacitive losses of the MOSFET. In many applications, the capacitive losses dominate the switching losses under typical load conditions.

The ohmic losses are proportional to the square of the load current, while the capacitive losses do not depend on the load current. Therefore, dependent on the specific load conditions, the ohmic losses or the capacitive losses may prevail. For example, when a load connected to the MOSFET draws a low load current, so that a low current flows through the MOSFET in its on-state, the capacitive losses may mainly determine the overall losses. Whereas, when the load draws a high load current, the ohmic losses and switching losses during transition phases may mainly determine the overall losses. The switching losses during transition phases and the capacitive losses are directly proportional to the switching frequency of the device.

In addition, the output charge $Q_{OSS}$, which is the charge stored in the output capacitance, is important for some applications. For example, the turn off delay time of the MOSFET at low load currents is dominated by the output charge. This is the charge which has to be stored in the output capacitance before the transistor is completely turned off. This output charge is provided by the load current.

There is, therefore, a need to provide a circuit arrangement with a transistor component, such as a MOSFET, in which dependent on the load conditions the losses are minimized.

SUMMARY OF THE INVENTION

A first aspect relates to a circuit arrangement which includes a transistor component with a gate terminal, a control terminal, and a load path between a source and a drain terminal, and which further includes a drive circuit connected to the control terminal and configured to detect a load condition of the transistor component, to provide a drive potential to the control terminal, and to adjust the drive potential dependent on the load condition.

A second aspect relates to a method of driving a transistor component with a gate terminal, a control terminal, and a load path between a source and a drain terminal. The method includes: detecting a load condition of the transistor component; applying a drive potential to the control terminal; and adjusting the drive potential dependent on the load condition.

A third aspect relates to an integrated circuit for driving a transistor component with a gate terminal, a control terminal, and a load path between a source and a drain terminal. The integrated circuit includes a load condition evaluation unit for evaluating a load condition of the transistor component, and a drive potential generation circuit configured for applying a drive potential to the control terminal. The drive potential generation circuit is configured to adjust the drive potential dependent on the load condition.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
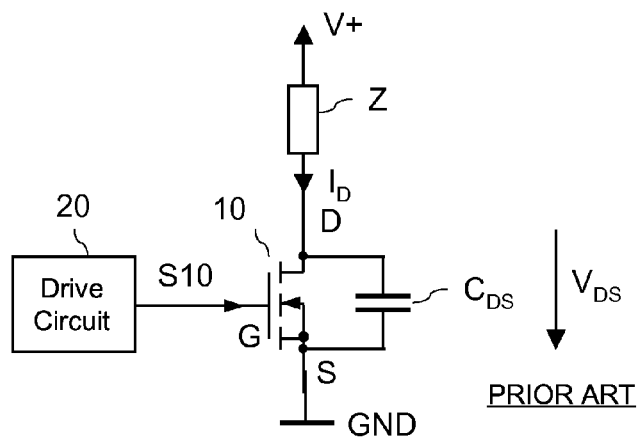
FIG. 1 shows a circuit arrangement which illustrates the use of a transistor component for switching a load current.

In order to provide a better understanding of embodiments of the invention which will be explained herein further below, FIG. 1 shows a circuit diagram which schematically illustrates the use of a transistor component 10 as an electronic switch which switches a current through a load Z. The transistor component 10, which in the example of FIG. 1 is implemented as a MOSFET, includes a gate terminal G which is configured to receive a drive signal S10 from a drive circuit 20, and a load path between a drain and a source terminal D, S. The load path D-S is connected in series with a load Z, wherein the series circuit with the transistor 10 and the load Z is connected between terminals for a first and a second supply potential V+, GND. The load Z can be a resistive load such as, e.g., a filament bulb, an inductive load such as a coil, a transformer or an induction motor, or a capacitive load.

The transistor 10 can be switched on and off by the drive circuit 20 which generates a suitable drive signal S10 at the gate terminal G of the transistor 10. The drive signal is, for example, a pulsewidth-modulated (PWM) signal. This is commonly known, so that no further explanations are required in this regard.

When the MOSFET is switched on, i.e., when the MOSFET is in its on-state, a load current $I_D$ flows through the load Z and the load path of the transistor 10, wherein the magnitude of the load current $I_D$ is mainly defined by the supply voltage present between the terminals for the first and second supply potential V+, GND and by the characteristic of the load Z. When the transistor 10 is in its on-state, ohmic losses occur in the transistor. These losses result from the on-resistance of the transistor 10 and the load current $I_D$ flowing through the transistor 10. These losses increase when the MOSFET changes its operation state from the on-state to the off-state, i.e., when the MOSFET is switched off, or vice versa. This is due to the simultaneous presence of high currents and high voltages at the load terminals D, S of the transistor in transition phases between the on-state and the off-state.

Figure 2:
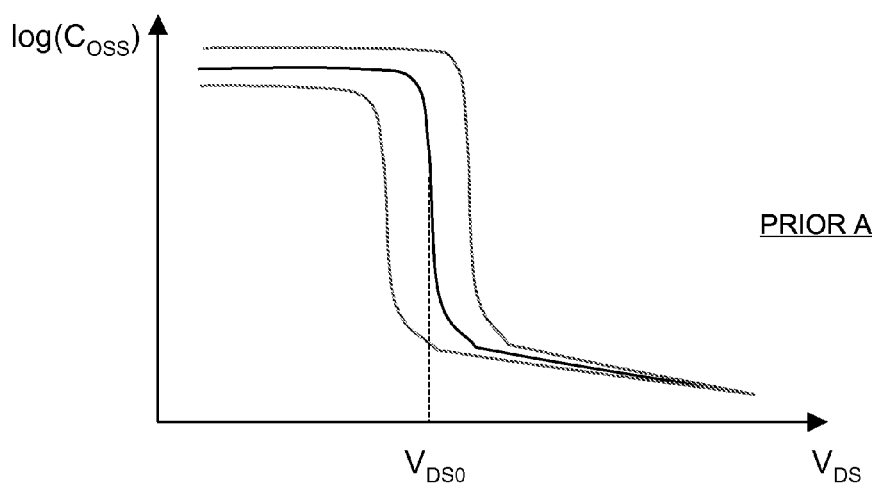
FIG. 2 schematically illustrates the voltage-dependency of an output capacitance of a transistor component.

Transistor components, in particular MOSFETs, include an output capacitance which is effective between the drain and the source and the drain and the gate terminals and usually includes a drain-source capacitance $C_{DS}$ between the drain and the source terminals D, S and a gate-drain capacitance $C_{GD}$ between the gate and the drain terminal. In FIG. 1 the drain-source capacitance $C_{DS}$ is schematically illustrated. It should be noted in this connection that the drain-source capacitance $C_{DS}$ and the drain-gate capacitance $C_{GD}$ can be regarded to be connected in parallel in a small-signal equivalent circuit diagram. A capacitance value $C_{OSS}$ of the output capacitance is dependent on the voltage between the drain and source terminals D, S of the transistor. The dependency of this capacitance value $C_{OSS}$ on the voltage $V_{DS}$ between the drain and source terminals D, S is schematically illustrated in FIG. 2.

When the transistor 10 is switched off and the voltage $V_{DS}$ across the load path of the transistor 10 increases, the output capacitance is charged, i.e., energy is stored in the output capacitance, and the output capacitance is discharged when the MOSFET is switched on. Charging the output capacitance when the MOSFET is switched off, and discharging the output capacitance when the MOSFET is switched on causes losses, which will be referred to as capacitive losses in the following.

Losses that occur when the transistor component 10 is operated in a switched-mode, i.e., when the transistor component 10 is cyclically switched on and off, include ohmic losses, switching losses during transition phases, and capacitive losses. Which of these losses prevail is dependent on the load condition of the transistor component 10. The load condition of the transistor component 10 is mainly defined by the load current $I_D$ flowing through the transistor 10 in its on-state, but is also defined by the switching frequency at which the transistor is switched on and off.

The capacitive losses are dependent on the energy which is stored in the output capacitance when the transistor 10 is switched off. This energy is dependent on the capacitance value $C_{OSS}$ of the output capacitance and the maximum voltage across the load path of the transistor 10 when the transistor is in its off-state.

There are transistor components in which the capacitance value $C_{OSS}$ of the output capacitance is dependent on the voltage across the load path of the transistor. FIG. 2 schematically illustrates such voltage-dependency of the output capacitance value $C_{OSS}$ on the voltage across the transistor. In FIG. 2, $C_{OSS}$ denotes the output capacitance value, and $V_{DS}$ denotes the voltage between the drain and source terminals D, S of the transistor. As can be seen from FIG. 2, there is a voltage $V_{DS0}$ at which the output capacitance value $C_{OSS}$ significantly decreases when the voltage $V_{DS}$ increases.

It will be explained hereinbelow that the voltage $V_{DS0}$ can be dependent on several factors. In FIG. 2, besides the curve in which the output capacitance value $C_{OSS}$ rapidly decreases at $V_{DS0}$, two further curves are shown in which the capacitance value rapidly decreases at a voltage higher than $V_{DS0}$ and rapidly decreases at a voltage lower than $V_{DS0}$, respectively. The $V_{DS0}$ voltage can be dependent on the maximum capacitance value, which occurs at low drain-source voltages $V_{DS}$. According to one embodiment, the $V_{DS0}$ voltage decreases with decreasing maximum capacitance value $C_{OSS}$.

The energy $E_{OSS}$ stored in the output capacitance is given by:

$$E_{OSS} = \int_{V_{DSon}}^{V_{DSoff}} C_{OSS}(V_{DS}) V_{DS} dV_{DS} \tag{1a}$$

where $V_{DSon}$ is the voltage across the load path when the transistor 10 is in its on-state, and $V_{DSoff}$ is the voltage across the load path when the transistor is in its off-state. $C_{OSS}(V_{DS})$ is the output capacitance value which is dependent on the voltage $V_{DS}$. Since the voltage $V_{DSon}$ across the transistor in its on-state is, usually, very low and significantly lower than the voltage $V_{DSoff}$ in the off-state, equation (1a) can be simplified to:

$$E_{OSS} = \int_{0}^{V_{DSoff}} C_{OSS}(V_{DS}) V_{DS} dV_{DS}. \tag{1b}$$

It can be seen from FIG. 2 and from equations (1a) or (1b), respectively, that the energy $E_{OSS}$ stored in the output capacitance and, thus, the capacitive losses can be reduced by decreasing the voltage value $V_{DS0}$ at which the output capacitance value $C_{OSS}$ decreases as well as by reducing the plateau-value, i.e., the maximum capacitance value, at low $V_{DS}$.

Two embodiments of transistor components which have a voltage-dependent output capacitance and in which the voltage-dependency of the output capacitance can be adjusted will now be explained with reference to FIGS. 3 and 5. It should be noted that FIGS. 3 and 5 only schematically illustrate two types of transistor components with voltage-dependent output capacitances. The transistor components illustrated in FIGS. 3 and 5 can be modified in many different ways. Further, other types of transistor components with voltage-dependent output capacitances exist which can be used in connection with embodiments of the present invention as well.

Figure 3:
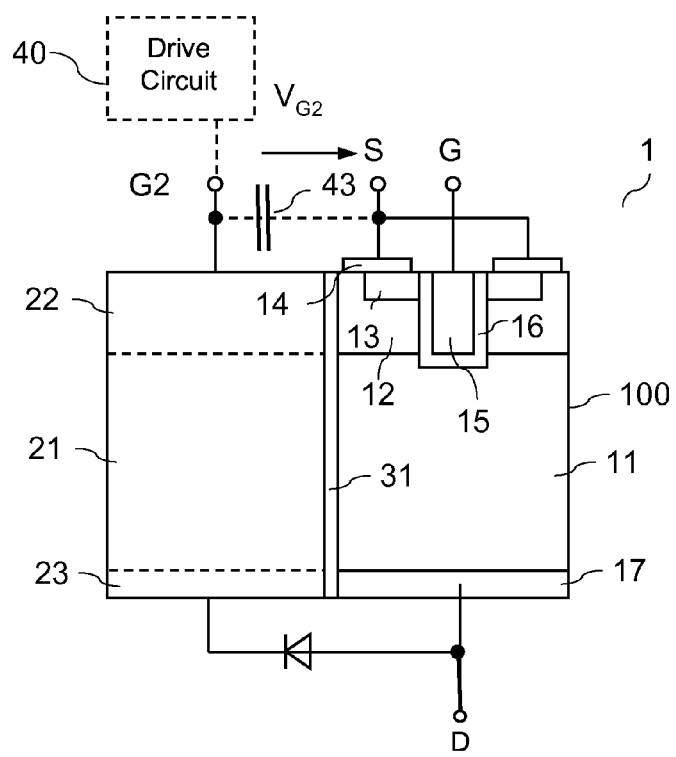
FIG. 3 schematically illustrates a first embodiment of a transistor component which has a voltage-dependent output capacitance.

The transistor component 1 illustrated in FIG. 3 is implemented as a MOSFET and includes a source region 13 connected to a source terminal S, and a drain region 17 connected to a drain terminal D. The MOSFET further includes a drift region 11 and a body region 12, wherein the body region 12 is arranged between the source region 13 and the drift region 11, and the drift region 11 is arranged between the body region 12 and the drain region 17. The source region 13, the body region 12, the drift region 11 and the drain region 17 are integrated in a semiconductor body 100. The MOSFET according to FIG. 3 is implemented as a vertical MOSFET, which is a MOSFET in which the source region 13 and the drain region 17 are arranged distant to one another in a vertical direction of the semiconductor body 100; in this case, a current essentially flows in a vertical direction through the semiconductor body 100 when the MOSFET is in its on-state. However, implementing the MOSFET as a vertical MOSFET is only an example. The basic principle that will be explained hereinbelow is also applicable to lateral MOSFETs in which the source and the drain regions are arranged distant to one another in a lateral direction of a semiconductor body.

The source region 13 and the body region 12 are both connected to a source electrode 14, with the source electrode 14 being connected to the source terminal S. This is common practice in MOSFETs.

The MOSFET further includes a gate electrode 15 connected to a gate terminal G. The gate electrode 15 is arranged adjacent to the body region 12, wherein a gate dielectric 16 is arranged between the gate electrode 15 and the body region 12. In a commonly known manner the gate electrode 15 serves to control a first conducting channel in the body region 12 between the source region 13 and the drift region 11. In the embodiment illustrated in FIG. 3, the gate electrode 15 is a trench-electrode, i.e., the gate electrode 15 is arranged in a trench of the semiconductor body 100. However, this is only an example. The gate electrode 15 could also be implemented as a planar electrode on top of the semiconductor body.

The MOSFET is in its on-state, when an electrical potential applied to the gate terminal G is suitable for generating a first conducting channel along the gate dielectric 16 in the body region 12, and the MOSFET is in its off-state, when there is no suitable drive potential at the gate terminal G for generating a conducting channel along the gate dielectric 16.

The MOSFET can be implemented as an enhancement MOSFET. In this case, the body region 12 is doped complementarily to the source region 13. The first conducting channel generated in the body region 12 controlled by the gate electrode 15 is an inversion channel in this case. Further, the MOSFET can be implemented as an n-type or as a p-type MOSFET. In an n-type MOSFET the source region 13 and the drain region 17 are n-doped, while in a p-type MOSFET the source region 13 and the drain region 17 are p-doped.

The MOSFET according to FIG. 3 further includes a drift control region 21 which is arranged adjacent to the drift region 11 and which is dielectrically insulated from the drift region 11 by a drift control region dielectric 31. The drift control region 21 includes a monocrystalline semiconductor material and serves to generate a second conducting channel in the drift region 11 along the drift control region dielectric 31 when the MOSFET is in its on-state. This conducting channel helps to decrease the on-resistance of the MOSFET. When the MOSFET is in its on-state the load current in the drift region 11 mainly flows through the second conducting channel along the gate control region dielectric 31. Like in a conventional MOSFET the doping type of the drift region 11 can correspond to the doping types of the source and the drain regions 13, 17. In this case the conducting channel along the gate control dielectric 31 is an accumulation channel.

However, unlike conventional MOSFETs, the drift region 11 partly or completely could also be doped complementarily to the source and the drain regions 13, 17. When the gate dielectric 16 and the gate control dielectric 31 are arranged distant to one another in a horizontal direction, so that a conducting channel in the body region 12 and a conducting channel along the drift control region dielectric 31 are arranged distant to one another in the horizontal direction, the drift region 11 should include a least one section which has the same doping typing as the source region 13 and which extends from the first channel region at the gate dielectric 16 to the second channel region at the drift control region dielectric 31.

The doping type of the drift control region 21 can correspond to the doping type of the drift region 11 or complementarily to the doping type of the drift region 11. Further, the drift region 11 could be implemented with two differently doped sections from which one has the doping type of the drift control region and the other one is doped complementarily.

To generate the second conducting channel in the drift region 11 along the drift control region dielectric 31 a positive electrical potential of the drift control region 21 relative to the electrical potential of the drift region 11 or relative to the electrical potential of the drain region 17 is required in an n-type component where the second conduction channel consists of an electron channel. For an n-type component the second conducting channel is an accumulation channel when the drift region 11 is n-doped, and is an inversion channel when the drift region 11 is p-doped. The drift control region 21 is coupled to a control terminal G2 at which a drive potential required for generating the conducting channel in the drift region 11 can be provided to the drift region 21. Optionally, a capacitive storage element $C_{DCR}$ like a capacitor can be connected between the control terminal G2 and the source terminal. When, in an n-type MOSFET, the drift control region 21 is n-doped, a p-type semiconductor region 22 can be arranged between the control terminal G2 and the drift region 21. This p-type region 22 delivers the positive charge carriers (holes) which are required to charge the drift region 21 to the positive potential required for generating the second conducting channel in the drift region 11 along the drift control region dielectric 31.

While the electrical potential at the gate terminal G of the MOSFET varies dependent on the desired operation state (on-state of off-state) of the MOSFET, the electrical potential at the control terminal G2 can be kept constant over the switching cycle. This electrical potential at the control terminal G2 can be constant relative to the electrical potential at the source terminal S.

The electrical potential at the control terminal G2 can also assume different values in the on-state and the off-state of the MOSFET, dependent on the capacitance 43 and depth and thickness of the dielectric layer 31. In this case the drive potential provided to the control terminal can, e.g., be provided only during a part of the off-state or only during a part of the on-state by, e.g., charging or discharging the drift control zone 21 during this time. The potential at the control terminal during the rest of the time is then determined by the transistor layout such as capacitance 43 and depth and thickness of the dielectric layer 31. This will again be explained herein further below.

When the MOSFET is switched off, i.e., when the conducting channel along the gate dielectric 16 is interrupted, and when a voltage is applied between the drain and source terminals (a positive voltage at the drain terminal in an n-type MOSFET and a negative voltage in a p-type MOSFET) a depletion zone expands in the drift region 11. This depletion zone, or the electric field associated with the depletion zone, also prevents the drift region 21 from being depleted of charge carriers, and the second conducting channel along the drift control region dielectric 31 is interrupted.

Referring to FIG. 3, the drift region 21 is coupled to the drain terminal D via a rectifier element 23, such as a diode. This rectifier element is biased such that the electrical potential of the drift region 21 can increase above the electrical potential of the drain terminal D. During the off-state of the component, the rectifier element 23 is biased in a forward direction and the potential at that region of the drift control region to which the diode 23 is connected is fixed at the potential of the drain terminal D minus the forward voltage drop of the rectifier element 23. Optionally, the drift control region 21 includes a higher doped contact region 24 to which the diode 23 is connected. Thus the rectifier element 23 helps to prevent the accumulation of thermally generated charge carriers in the drift region 21 when the component is in its off-state.

The operating principle which has been explained for an n-type MOSFET hereinbefore also applies to a p-type MOSFET, wherein in a p-type MOSFET the individual semiconductor regions have a complementary doping type, the voltages have a reversed polarity, and polarity-dependent components, like diodes, have their terminals interchanged.

The MOSFET according to FIG. 3 has an output capacitance with an output capacitance value $C_{OSS}$ that has a characteristic according to FIG. 2 and which significantly decreases when the voltage reaches a threshold value $V_{DS0}$. The characteristic illustrated in FIG. 2 in which the output capacitance value $C_{OSS}$ has a high value for voltages below the threshold value $V_{DS0}$, and have a lower value for voltages above the threshold value $V_{DS0}$ is equivalent to the fact that at voltages lower than the threshold value $V_{DS0}$ a higher charge has to be provided to the load path of the transistor to increase the voltage across the load path for a given voltage value $\Delta V_{DS}$ than at higher voltages, i.e., voltages higher than the threshold voltage $V_{DS0}$. The capacitance value at lower voltages can be up to 100 times to 1000 times higher than the capacitance value at higher voltages, i.e. at lower voltages a charge for increasing the voltage for $\Delta V_{DS}$ is 100 times to 1000 times higher than the charge required at higher voltages. Such MOSFETs can be designed to have a breakdown voltage of between 50V and 2000V. The voltage $V_{DS0}$ at which the output capacitance decreases is, for example, between 5V and 50V for such MOSFETs.

The mechanism that causes this voltage-dependency of the output capacitance value in the MOSFET according to FIG. 3 will now be explained. When the MOSFET is in its on-state charge carriers are accumulated in the drift region 11 along the drift control region dielectric 31, wherein these charge carriers form the accumulation or inversion channel in the drift region 11. This accumulated charge exceeds the background charge—resulting from the basic doping—of the drift region 11 and consists of electrons in case of an n-channel transistor. The same amount of charge of the opposite type builds up an accumulation or inversion channel in the drift control region 21. Both accumulated charge amounts are situated on both sides of the accumulation dielectric 31. In the on-state there is a capacitor with a huge capacitance $C_{DDCR}$ between the drain region 17 and drift region 11 on the one side and the drift control region 21 on the other side. The drift control region dielectric 31 forms the capacitor dielectric of this capacitor. This capacitor lies in series with the voltage source (not shown in FIG. 3) connected to the control terminal G2 and the source terminal S and/or the optional capacitor 43 connected between the drift control region 21 and the source terminal S. The capacitor with the capacitance $C_{DDCR}$ significantly contributes to the drain-source capacitance $C_{DS}$ and, thus, significantly contributes to the output capacitance $C_{OSS}$. When the MOSFET is switched off, i.e., when the channel along the gate dielectric 16 is interrupted, these electrical excess charges accumulated along the drift control region dielectric 31 have to be removed from the drift region 11, before the voltage across the drift region 11 and, thus, the voltage between the drain and source terminals D, S, can significantly increase. When the charges accumulated along the drift control region dielectric 31 have been removed a depletion region expands in the drift region 11 and the voltage across the drift region 11 increases. At the time when the drain-source voltage $V_{DS}$ in the transition between the on-state and the off-state reaches the initial voltage of the drift control region 21, i.e., the voltage at the control terminal G2, the accumulation charges on both sides of the accumulation dielectric 31 vanish and thus the capacitor $C_{DDCR}$ built up by accumulation charges disappears. The slope of the decrease of the capacitance $C_{DDCR}$ is steep and occurs at a voltage $V_{DS0}$ shown in FIG. 2 which is close to the initial voltage $V_{G2}$ of the drift control region 21. When the depletion region expands in the drift region 11 also charge carriers are stored in the drift region 11, however, the amount of charge carriers required for increasing the voltage $V_{DS}$ for a given voltage difference $\Delta V_{DS}$ is significantly lower than the amount of charge carriers required for increasing the voltage $V_{DS}$ when charge carriers are still accumulated along the drift control region dielectric 31. In the MOSFET according to FIG. 3 the voltage $V_{DS0}$ (see FIG. 2) at which the output capacitance value $C_{OSS}$ significantly decreases is, therefore, the voltage at which the charge carriers accumulated along the drift control region dielectric 31 have been removed and at which the depletion region starts to expand in the drift region 11.

The threshold voltage $V_{DS0}$ at which the output capacitance value $C_{OSS}$ decreases, i.e., at which the charge carriers accumulated in the drift region 11 have been removed, as well as the maximum of the output capacitance value $C_{OSS}$, which occurs at low drain-source voltages $V_{D's}$, is dependent on the drive potential $V_{G2}$ applied to the drift control region 21, wherein the threshold voltage $V_{DS0}$ increases when the potential applied to the drift control region 21 increases. In other words, the amount of charge carriers accumulated along the drift control region dielectric 31 increases with increasing electrical potential $V_{G2}$ of the drift control region 21.

The drive potential $V_{G2}$ is provided by a drive circuit 40 (illustrated in dashed lines) connected to the control terminal G2. The operating principle and embodiments of the drive circuit 40 will be explained herein further below. When the electrical potential $V_{G2}$ at the control electrode G2 is supplied by a drive circuit 40 with a low internal impedance the slope of the decrease of $C_{OSS}$ is very steep and occurs right at the voltage $V_{DS0}$ shown in FIG. 2. In this case, the electrical potential at the control terminal G2 is approximately constant, charges that are removed from the drift control region 21 when the transistor transitions into the off-state flow into the drive circuit 40 and these charges are again provided by the drive circuit 40 when the transistor is switched on again.

When the electrical potential $V_{G2}$ is supplied by a drive circuit 40 with a higher internal impedance, an additional capacitor, like the capacitor 43 of FIG. 3, can be connected between the drift control region 21 or terminal G2 and, e.g., the source electrode S of the transistor. This capacitor can be part of the drive circuit 40. When the drive circuit 40 has a higher impedance, charges from the drift control region 21 cannot flow back or cannot completely flow back into the drive circuit. In this case a decrease of the accumulation charge along the accumulation dielectric 31 leads to an increase of the charge of capacitor 43, to an increase of the voltage across the terminals of capacitor 43 and, finally, to an increase of the potential at terminal G2. An increased voltage at the terminal G2 influences the voltage $V_{DS0}$ in such a manner that $V_{DS0}$ is also increased. By adjusting the capacitance 43 and the internal impedance of the voltage source (not shown) connected to the control terminal G2 the slope with which the capacitance value $C_{OSS}$ decreases with increasing $V_{DS}$ can be adjusted.

Referring to the discussion in the last paragraph, the electrical potential $V_{G2}$ at the control terminal G2 may vary when the transistor transitions from the on-state to the off-state, or vice versa, wherein a potential difference or potential swing between the electrical potential in the on-state and the off-state can be dependent on the internal impedance of a drive circuit which provides the drive potential $V_{G2}$ and a capacitance value of the capacitance 43. This potential swing automatically occurs when the charges that are removed from the drift control region 21 when the transistor transitions into the off-state are not completely absorbed by the drive circuit 40 but are buffered in the capacitance 43 until the transistor 1 is again switched on.

In case the drive potential $V_{G2}$ is generated such that potential swings can occur during one switching cycle which includes an on-state and an off-state, adaptations or changes of the drive potential $V_{G2}$ through the drive circuit 40 are only performed either during the on-states or during the off-states, or even only during a part of the on-state or a part of the off-state. Otherwise, stability problems in controlling the drive potential $V_{G2}$ may occur. To adjust the drive potential $V_{G2}$ only during the on-state or the off-state or even only during a part of the on-state or off-state, the drive circuit 40 is, for example, configured to have a low output impedance only during those times in which the drive potential is to be adjusted, and has a high output impedance at other times. The high output impedance allows the electrical potential at the control terminal G2 to swing without loading the drive circuit 40. The drive potential that the drive circuit 40 applies to the control terminal G2 during those times in which it has a low output impedance can be kept constant during the switching cycle or even during a plurality of switching cycles. This potential is only adapted dependent on the load conditions.

Figure 4:
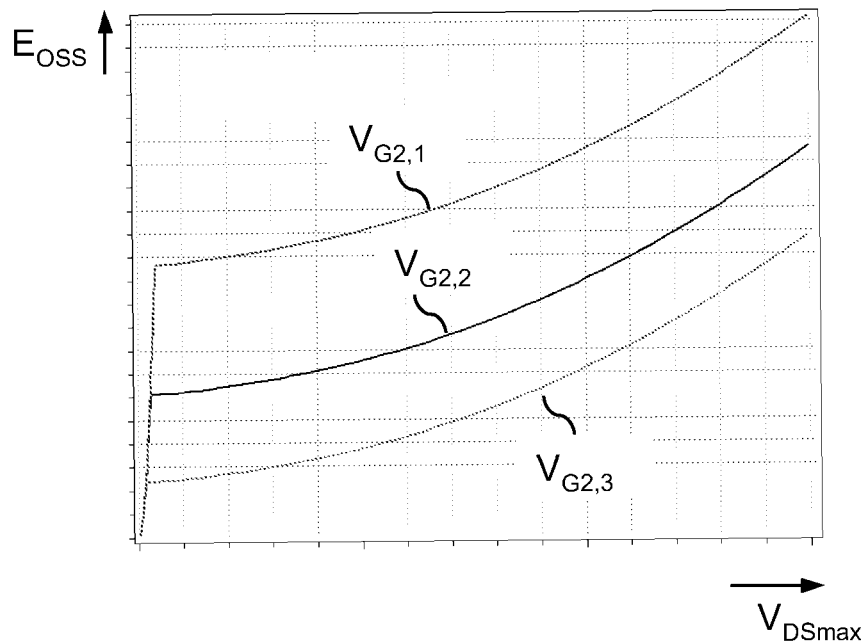
FIG. 4 schematically illustrates the energy stored in the output capacitance of a transistor component according to FIG. 3 dependent on a drive potential at a control terminal and dependent on a voltage across a load path of the transistor.

In the MOSFET according to FIG. 3, the electrical charge stored in the output capacitance when the MOSFET is switched off and the electrical energy $E_{OSS}$ stored in the output capacitance are, therefore, dependent on the electrical potential of the drift control region 21. FIG. 4 shows simulation results obtained for a MOSFET according to FIG. 3, wherein in FIG. 4 the electrical energy $E_{OSS}$ stored in the output capacitance dependent on the maximum drain-source-voltage at the terminals of the transistor when switching-off the transistor is shown. The energy $E_{OSS}$ is illustrated for three different potentials of the drift control region 21, which in the present example are $V_{G2,1}=13V$, $V_{G2,2}=10V$ and $V_{G2,3}=7V$. In the present example, the electrical energy stored in the output capacitance was reduced by about 50% at the highest voltages $V_{DS}$ when the electrical potential $V_{G2}$ of the drift control region 21 was reduced from 13V to 7V. While the reduced $E_{OSS}$ is beneficial for the capacitive losses, apparently the on-resistance ($R_{DSon}$) of the MOSFET increases when $V_{G2}$ is reduced from 13V to 7V. This is however negligible, when the MOSFET is switched under low load conditions. The on-resistance is the resistance between the drain and source terminals D, S when the MOSFET is in its on-state.

Figure 5:
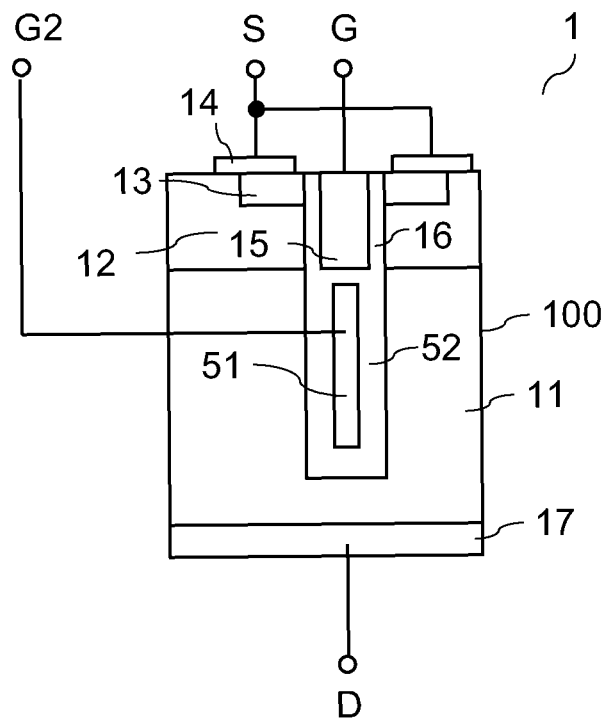
FIG. 5 schematically illustrates a second embodiment of a transistor component which has a voltage-dependent output capacitance.

FIG. 5 illustrates a further embodiment of a MOSFET with a voltage-dependent output capacitance value $C_{OSS}$. This MOSFET, instead of a drift control region 21 adjacent to the drift region 11, includes a field electrode 51. The field electrode 51 includes, for example, a metal or a highly doped polycrystalline semiconductor material, like polysilicon. The field electrode 51 is arranged adjacent to the drift region 11 and is dielectrically insulated from the drift region 11 by a field electrode dielectric 52. The field electrode 52 is connected to the control terminal G2. In the embodiment illustrated in FIG. 5, the field electrode 51 is arranged below the gate electrode 15, wherein the gate electrode 15 and the field electrode 51 are arranged in a common trench of the semiconductor body 100 and are dielectrically insulated from one another. However, to arrange the gate electrode 15 and the field electrode 51 in the same trench is only an example. The field electrode 51 could also be arranged in a separate trench. Further, the gate electrode 15 can be implemented as a planar electrode arranged on the semiconductor body 100. The MOSFET illustrated in FIG. 5 is implemented as a vertical transistor. However, this type of transistor could be implemented as a lateral transistor as well. Further, arranging the gate electrode 15 in a trench is only an example. The gate electrode could also be implemented as a planar electrode above a surface of the semiconductor body 100. This also applies to the MOSFET according to FIG. 3.

Like the MOSFET according to FIG. 3, the MOSFET according to FIG. 5 can be implemented as an enhancement MOSFET. In this case the body region 12 is doped complementarily to the source region 13 and the drain region 17. The MOSFET can be implemented as an n-type MOSFET or as a p-type MOSFET. In an n-type MOSFET the source and the drain regions 13, 17 as well as the drift region 11 are n-doped, while in a p-MOSFET the source region 13, drain region 17 and the drift region 11 are p-doped. The operating principle of the MOSFET according to FIG. 5 will now be explained with reference to an n-MOSFET. However, this operating principle is also valid for a p-type MOSFET, wherein in this case the doping types of the individual semiconductor regions are complementary to the doping types of an n-MOSFET, and the polarities of voltages have an opposite sign.

When the MOSFET is in operation a fixed drive potential or drive voltage can be applied to the control terminal G2. This drive voltage $V_{G2}$ is, for example, a voltage relative to the potential of the source terminal S. The operation state of the MOSFET is defined by the electrical potential at the gate terminal G, where this potential varies dependent on the desired operation state (on-state or off-state) of the MOSFET. In an n-type MOSFET the drive voltage $V_{G2}$ at the control terminal G2 is, for example, a positive voltage. When the MOSFET is in its on-state a first conducting channel is generated by the gate electrode 15 along the gate dielectric 16 in the body region 12. In an enhancement MOSFET this conducting channel is an inversion channel. Further, a second conduction channel, which is an accumulation channel, may be generated by the field electrode 51 in the drift region 11 along the field electrode dielectric 52 to further reduce the resistance of the typically low ohmic drift region 11.

When the MOSFET is switched off and the first conducting channel along the gate dielectric 16 is interrupted, the mechanism is the same as in the MOSFET according to FIG. 3, i.e. charge carriers that form the second conducting channel in the drift region 11 have to be removed before a depletion region expands in the drift region 11. In the MOSFET according to FIG. 5 the charge carriers that form the second conducting channel are accumulated along the field plate dielectric 52. Unlike the MOSFET according to FIG. 3, in which the electrical potential of the drift control region 21 increases when a depletion region expands in the drift region 11, the field electrode 51 can be kept at the drive potential $V_{G2}$ when the MOSFET is in its off-state. In this operation state the field electrode 51 partly "compensates" dopant charges in the drift region 11, so that the field electrode 51 at a given dopant concentration of the drift region 11 helps to increase the voltage blocking capability of the component.

Like in the device of FIG. 3, a capacitance could be connected to the control terminal G2, and could, in particular be connected between the control terminal G2 and the source terminal. In this case, the electrical potential at the control terminal G2 can also have different values in on- and off-state of the MOSFET, dependent on the capacitance 43 and depth and thickness of the dielectric layer 52. The drive potential provided to the control terminal can, e.g., be provided only during a part of the off-state or only during a part of the on-state by, e.g., charging or discharging the drift control zone during this time. The potential at the control terminal during the rest of the time is then determined by the transistor layout such as the capacitance 43 and the depth and the thickness of the dielectric layer 52.

Like in the MOSFET according to FIG. 3 the electrical energy stored in the output capacitance increases with increasing drive potential $V_{G2}$ at the control terminal G2.

Referring to the explanation provided with reference to FIGS. 3 to 5 and in particular with reference to FIG. 4, the electrical energy stored in the output capacitances of the transistors according to FIGS. 3 and 5 decreases, when the drive potential $V_{G2}$ at the control terminal G2 is decreased. However, when the drive potential at the control terminal G2 is decreased, the performance of the second conducting channel, which is controlled by the drive potential $V_{G2}$, decreases. When the performance of the second conducting channel decreases, the ohmic losses during the on-state are increased. There is, therefore, a tradeoff between ohmic losses and capacitive losses, wherein this tradeoff is dependent on the load condition of the transistor. The load condition is, for example, defined by the load current flowing through the transistor in its on-state and/or by a switching frequency at which the transistor is operated. When, for example, the load current is high, it is desirable to reduce the on-resistance in order to decrease the ohmic losses, even if this results in a small increase of the total switching losses. Although the capacitive losses are independent of the current the switching losses in transition phases during turn-on and/or during turn-off increase at high load currents. The ohmic losses mainly govern the overall losses at high load currents because they increase with the square of the load current. At low load currents it is, however, desirable to decrease the capacitive losses by reducing the energy stored in the output capacitance at each switching cycle, because at low load currents the capacitive losses mainly govern the overall losses. When the switching frequency is low, it is desirable to reduce the ohmic losses, because at low switching frequencies the ohmic losses mainly govern the overall losses.

A circuit arrangement with a transistor 1 which, besides a gate terminal G, has a control terminal G2 which influences a voltage-dependency of an output capacitance $C_{OSS}$ ($C_{OSS}$ not shown in FIG. 6) and with a drive circuit which in view of losses operates the transistor 1 in an optimum operation point will now be explained with reference to FIG. 6. The transistor 1 can be implemented in accordance with one of the principles explained with reference to FIGS. 3 and 5. However, any other type of transistor which, besides a gate terminal, includes a control terminal which is configured to adjust the voltage-dependency of an output capacitance can be used as well.

Figure 6:
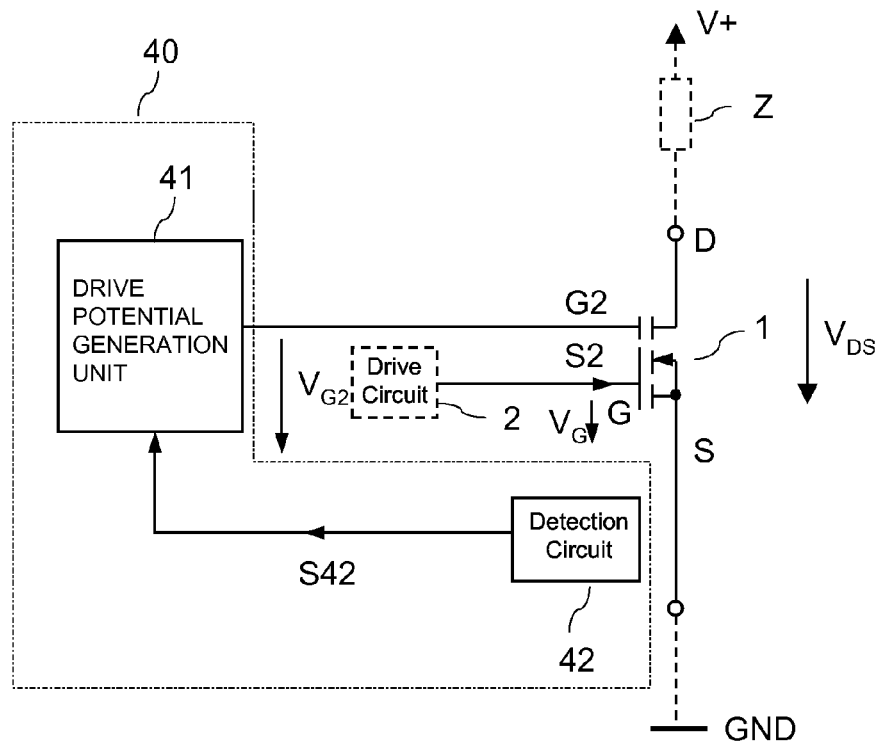
FIG. 6 illustrates a circuit arrangement including a transistor component with a gate terminal and a control terminal, and including a drive circuit connected to the control terminal of the transistor component.

The MOSFET 1 can be switched on and off by a conventional gate drive circuit 2 (illustrated in dashed lines in FIG. 6). Such gate drive circuits are commonly known, so that no further explanations are required in this regard.

The circuit arrangement further includes a drive circuit 40 which is connected to the control terminal G2 and which is configured: to detect or determine a load condition of the transistor 1; to provide a drive potential $V_{G2}$ to the control terminal G2; and to adjust drive potential $V_{G2}$ dependent on the load condition of the transistor. The drive potential $V_{o2}$ is, for example, a voltage relative to the potential at the source terminal S of the transistor 1.

The drive circuit 40 includes a load condition detection circuit 42 which is configured to detect or to determine a load condition of the transistor 1 and to provide an adjustment signal S42 dependent on the detected load condition. A drive potential generation circuit 41 receives the adjustment signal S42 and is configured to generate the drive potential $V_{G2}$ dependent on the adjustment signal S42. The drive potential $V_{G2}$ changes physical parameters of the MOSFET 1 such as the dependence of the output capacitance $C_{OSS}$ on the drain to source voltage $V_{ds}$. Thereby the electrical behavior of the MOSFET can be optimized such as losses or ruggedness.

In the embodiment illustrated in FIG. 7, the drive potential $V_{G2}$ results from a voltage across a capacitor 43—which will also be referred to as drive capacitor in the following—connected between the control terminal G2 and the source terminal S. This capacitor can be identical with the capacitor 43 of FIG. 3 which (in the off-state of a transistor according to FIG. 3) can buffer electrical charge (from the drift control region 21).

Optionally a switching element 45 is connected between the drive potential generation circuit 41 and the control terminal G2. According to one embodiment this switching element 45 is driven such that it connects the drive potential generation circuit 41 only during either the on-states or the off-states to the control terminal G2, or even only during a part of the on-state or a part of the off-state. This switching element can, for example, be driven dependent on a drive signal S2 of the transistor 1. In case there are potential swings at the control terminal G2 during one switching cycle, wherein these swings may occur at specific types of transistors, like the transistor of FIG. 3, disconnecting the drive potential generation circuit 41 from the control terminal G2 during the on-states or the off-states prevents instabilities in generating the drive potential $V_{G2}$ dependent on the load condition. The drive circuit 40 and, more specifically, the drive potential generation circuit 41 has a high output impedance when the switching element 45 is in its off-state.

Instead of the switching element 45 a rectifier element, like a diode, can be connected between the drive potential generation circuit 41 and the capacitor 43. In this case, the capacitor 43 is only charged when the transistor is in its on-state, i.e. when the voltage swing of the voltage across the capacitor has a minimum. The voltage across the capacitor 43 is adjusted by the drive potential generation circuit 41, wherein the voltage can be increased by charging the capacitor 43 during the on-states of the transistor. The voltage across the capacitor 43 decreases due to leakage currents, which are inevitable, when the output voltage of the drive potential generation circuit 41 decreases below the voltage of the capacitor 43 in the on-state. Alternatively, a resistor (not shown) can be connected in parallel with the capacitor 43. This resistor slightly discharges the capacitor 43 between this time periods in which the capacitor is charged by the drive potential generation circuit 41.

Figure 7:
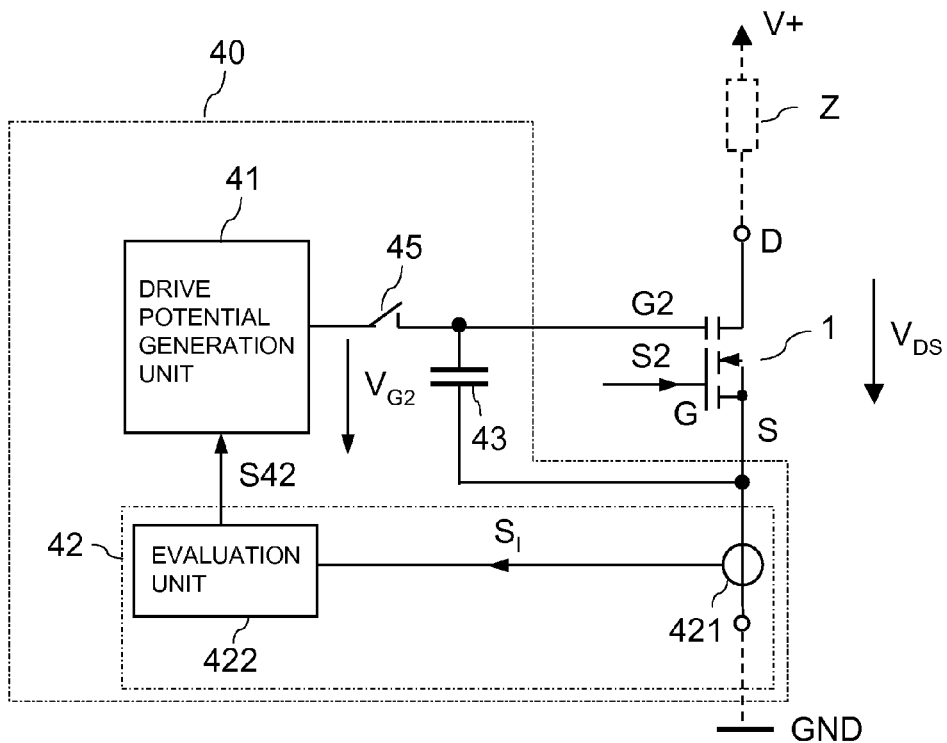
FIG. 7 illustrates an embodiment of the drive circuit which includes an evaluation circuit and a drive potential generation circuit.

According to one embodiment illustrated in FIG. 7, the load condition detection circuit 42 includes a current measurement unit 421 which is configured to measure or detect a load current $I_D$ flowing through the transistor 1, and to provide a current measurement signal $S_I$ which is dependent on the load current $I_{DS}$. According to one embodiment the current measurement signal $S_I$ is proportional to the load current $I_{DS}$. The current measurement unit 421 can be implemented like a conventional current measurement unit, such as a shunt, that is configured to measure a load current of a transistor, like transistor 1 of FIG. 7. In FIG. 7 the current measurement unit 421 is shown in the source path of transistor 1 just as an example. The current measurement unit 421 can be placed anywhere where it may seem appropriate to detect the load current flowing through transistor 1. Such current measurement units are commonly known, so that no further explanations are required in this regard. Instead of directly measuring the current through the transistor using a current measurement unit coupled to the load path, other means can be used which calculate or predict the load current of the transistor 1.

According to one embodiment, the load current is (approximately) determined by measuring the voltage drop across the transistor 1 in its on-state. Alternatively, the temperature of the transistor 1 is measured. The temperature is a measure for the electric power which is dissipated in the transistor, wherein the electric power is dependent on the load current. Thus, the temperature indirectly is a measure for the load current.

The load condition detection circuit 42 further includes an evaluation unit 422 which receives the current measurement signal $S_I$ and which is configured to detect the load condition of the transistor 1 dependent on the current measurement signal $S_I$. The evaluation unit 422 is further configured to generate the adjustment signal S42 dependent on the detected load condition.

Figure 8:
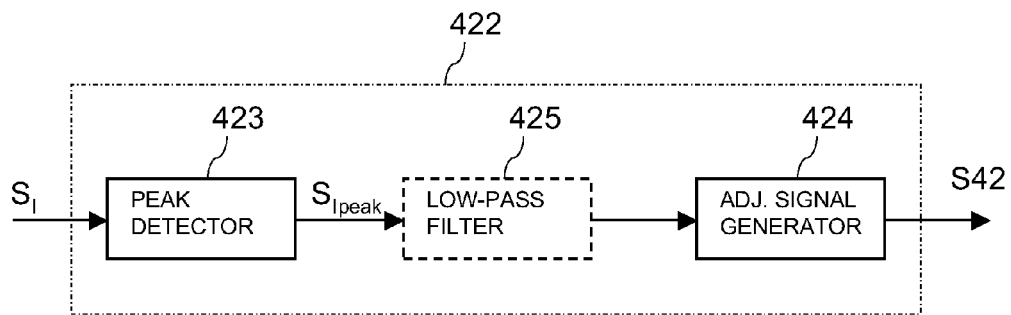
FIG. 8 illustrates a first embodiment of the evaluation circuit.

According to one embodiment the evaluation unit 422 is configured to detect the maximum of the load current $I_D$ by evaluating the current measurement signal $S_I$ and to generate the adjustment signal S42 based on the detected maximum value. A block diagram of an evaluation unit 422 having such functionality is illustrated in FIG. 8. This evaluation unit 422 includes a peak detector 423 which receives the current measurement signal $S_I$ and which provides a peak detection signal $S_{Ipeak}$. An adjustment signal generation unit 424 receives the peak signal $S_{Ipeak}$ and maps the peak signal $S_{Ipeak}$ to a corresponding signal value of the adjustment signal S42 provided at the output of the adjustment signal generation unit 424. According to one embodiment, the adjustment signal generation unit is configured to generate the adjustment signal S42 such that for peak signal values $S_{Ipeak}$ within a given signal range the adjustment signal S42 and, therefore, the drive potential $V_{G2}$ increases with increasing peak signal $S_{Ipeak}$. This functionality is illustrated in FIG. 10.

Figure 10:
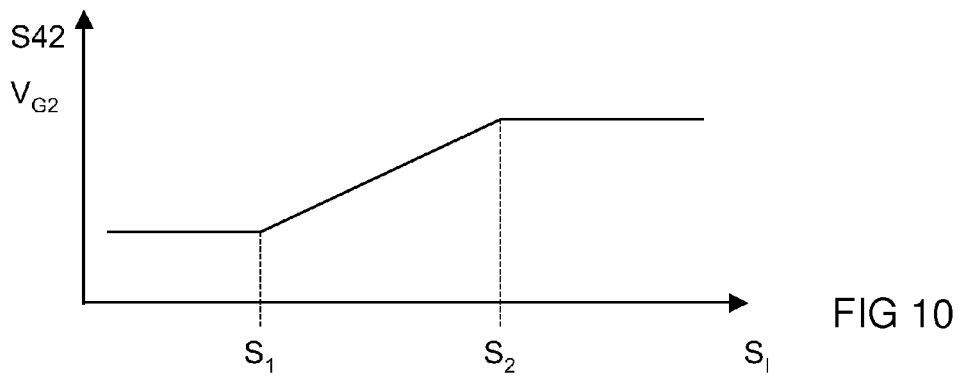
FIG. 10 illustrates the operating principle of a drive circuit according to a first embodiment.

In FIG. 10 the adjustment signal S42 or the drive potential $V_{G2}$, respectively, are shown dependent on the peak signal $S_{Ipeak}$. For peak signals within a signal range including signals between $S_1$ and $S_2$ the adjustment signal S42 increases with increasing peak signal $S_{peak}$. For peak signal values $S_{Ipeak}$ below $S_1$ and for peak signal values $S_{Ipeak}$ higher than $S_2$ the adjustment signal S42 is constant.

In the embodiment illustrated in FIG. 10, the adjustment signal S42 linearly increases when the peak signal $S_{Ipeak}$ increases. However, this is only an example. According to a further embodiment, the adjustment signal S42 increases exponentially when the peak signal $S_{Ipeak}$ increases, or increases with the square of the peak signal or piece-wise linear, when the peak signal $S_{Ipeak}$ increases. In order to prevent a short increase of the load current $I_D$ that negatively influences the adjustment of the drive potential $V_{G2}$, an optional low-pass filter 425 is connected between the peak detector 423 and the adjustment signal generation unit 424. In this embodiment a low-pass filtered version of the peak signal $S_{Ipeak}$ is received at the adjustment signal generation unit.

Figure 9:
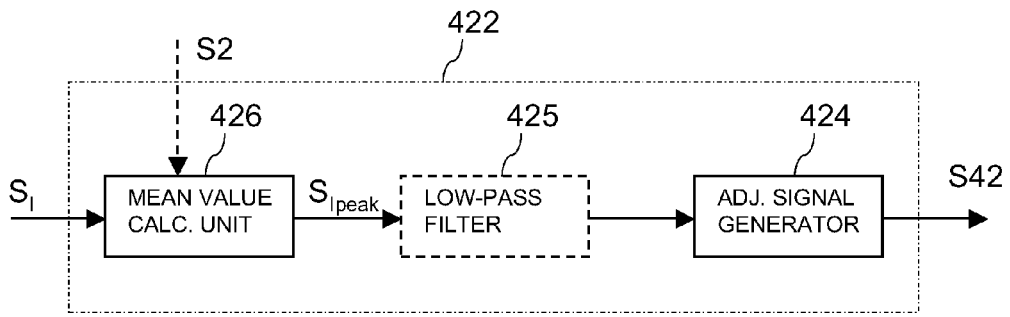
FIG. 9 illustrates a second embodiment of the evaluation circuit.

According to a further embodiment, the evaluation unit 422 is configured to evaluate a mean value or rms value of the load current $I_D$ within a given time frame and is configured to generate the adjustment signal S42 dependent on this mean value or rms value. An evaluation unit 422 having such functionality is schematically illustrated in FIG. 9. This evaluation unit 422 includes a mean value or rms value calculation unit 426 which receives the current measurement signal $S_I$, and which is configured to provide a mean value signal $S_{Imean}$ which is representative of the mean value or rms value of the load signal $I_D$ within a given time frame. The adjustment signal generation unit 424 receives the mean value signal $S_{Imean}$ and generates the adjustment signal S42 dependent on the mean value signal $S_{Imean}$. The generation of the adjustment signal S42 dependent on the mean value signal $S_{Imean}$ can correspond to the generation of the adjustment signal S42 dependent on the peak signal $S_{Ipeak}$ explained hereinbefore.

The mean value calculation unit 426 can be configured to determine the mean value or rms value during on-times and off-times of the transistor 1. According to a further embodiment the mean value calculation unit 426 is configured to calculate the mean value or rms value only during those times when the MOSFET 1 is in its on-state. For this, the mean value calculation unit 426 receives the drive signal S2 of the MOSFET which is representative for those times at which the MOSFET 1 is in its on-state.

Figure 11:
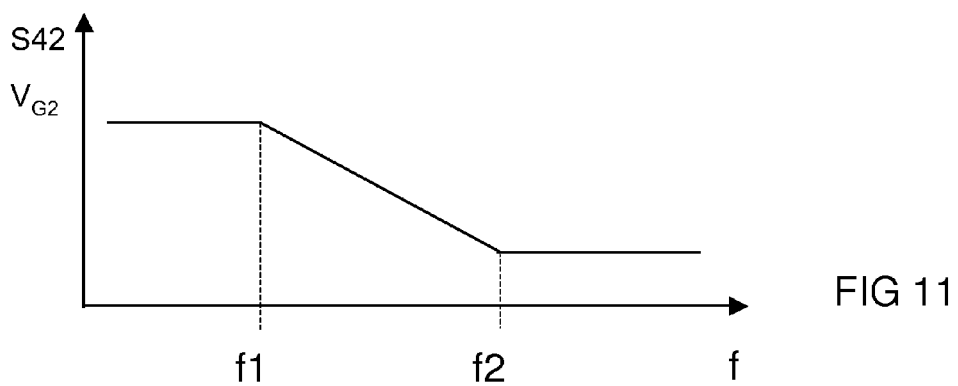
FIG. 11 illustrates the operating principle of a drive circuit according to a second embodiment.

According to a further embodiment (not illustrated) the evaluation unit 422 is configured to generate the adjustment signal S42 dependent on a switching frequency of a transistor 1. The switching frequency can be determined from the current measurement signal $S_I$ by calculating the time difference between two subsequent time periods at which the load current $I_D$ is zero, where time periods at which the load current is zero are off-periods of the transistor 1. The switching frequency can also be determined by evaluating the drive signal S2 at the gate terminal of the transistor or by evaluating a signal (not shown) controlling the gate drive unit 2. According to one embodiment, this type of evaluation unit 422 is configured to generate the adjustment signal S42 such that the adjustment signal S42 and, therefore, the drive potential $V_{G2}$, decreases—in order to reduce the capacitive losses—when the switching frequency increases. The dependency of the adjustment signal S42 or the drive potential $V_{G2}$, respectively, is illustrated in FIG. 11 for one embodiment. In FIG. 11, f denotes the switching frequency, which is the frequency of the drive signal S2. In this embodiment, the adjustment signal S42 or the drive potential $V_{G2}$, respectively, decreases when the switching frequency f is within a given frequency range between $f_1$ and $f_2$ and increases.

According to a further embodiment, both, a load current $I_D$ and a switching frequency f are taken into account when generating the adjustment signal S42. According to one embodiment a first adjustment signal $S42_i$ dependent on a load current is calculated, and a second adjustment signal $S42_f$ dependent on the switching frequency is calculated, and these two adjustment signals are combined, for example, by calculating a weighted sum of these two signals $S42_I$, $S42_f$, wherein according to one embodiment the first adjustment signal $S42_I$ has a higher weight.

Figure 12:
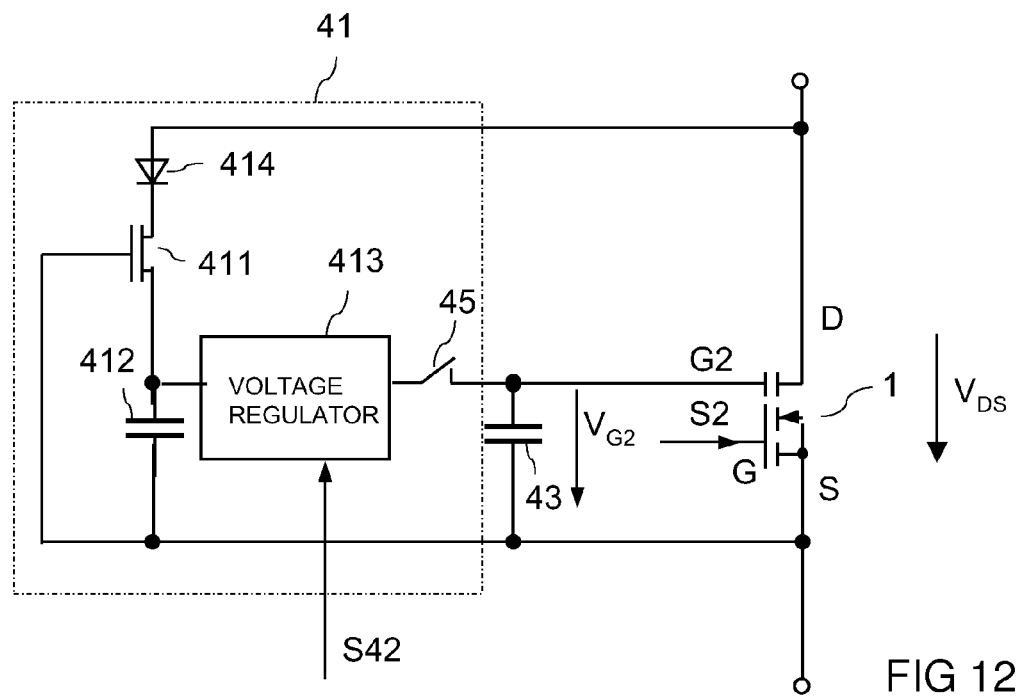
FIG. 12 illustrates a first embodiment of the drive potential generation circuit.

FIG. 12 schematically illustrates a first embodiment of the drive potential generation unit 41. This unit 41 includes a voltage regulator 413 which is configured to provide the drive potential $V_{G2}$ from an input voltage $V_{in}$ and dependent on the adjustment signal S42. Voltage generators like voltage generator 413, which are configured to provide an output voltage, like the drive potential $V_{G2}$, from an input voltage dependent on an input signal, like the adjustment signal S42, are commonly known, so that no further explanations are required in this regard.

The input voltage $V_{in}$ is available across an input capacitor 412 which is connected to a supply terminal. The supply terminal in the present embodiment is the drain terminal D of the transistor 1. The input voltage $V_{in}$ is a voltage related to the source potential, i.e. the potential at the source terminal S. The input capacitor 412 is charged each time the drain potential significantly rises above the source potential, i.e. when the transistor 1 is switched off. In the embodiment of FIG. 12 the input capacitor 412 is charged via a depletion transistor 411 which has its gate terminal connected to the source terminal and which has its load path connected between the drain terminal D and the input capacitor 412. In this circuit the input capacitor 412 is charged each time the drain-source voltage $V_{DS}$ is higher than the input voltage Vin and the input voltage Vin is lower than the pinch-off voltage of the depletion transistor 411. A rectifier element 414, like a diode, can be connected in series with the load path of the depletion transistor 411. This rectifier element 414 prevents the input capacitor 412 from being discharged when the drain potential decreases.

The drive potential $V_{G2}$ is available across a drive capacitor 43, which is connected between the control terminal G2 and the source terminal S. In this connection it should be mentioned that the power consumption at the control terminal G2 of the transistor 1 is rather low, because only capacitive displacement currents flow at this control terminal G2 and the frequency at which the potential $V_{G2}$ at the control terminal G2 is changed is also low.

Figure 13:
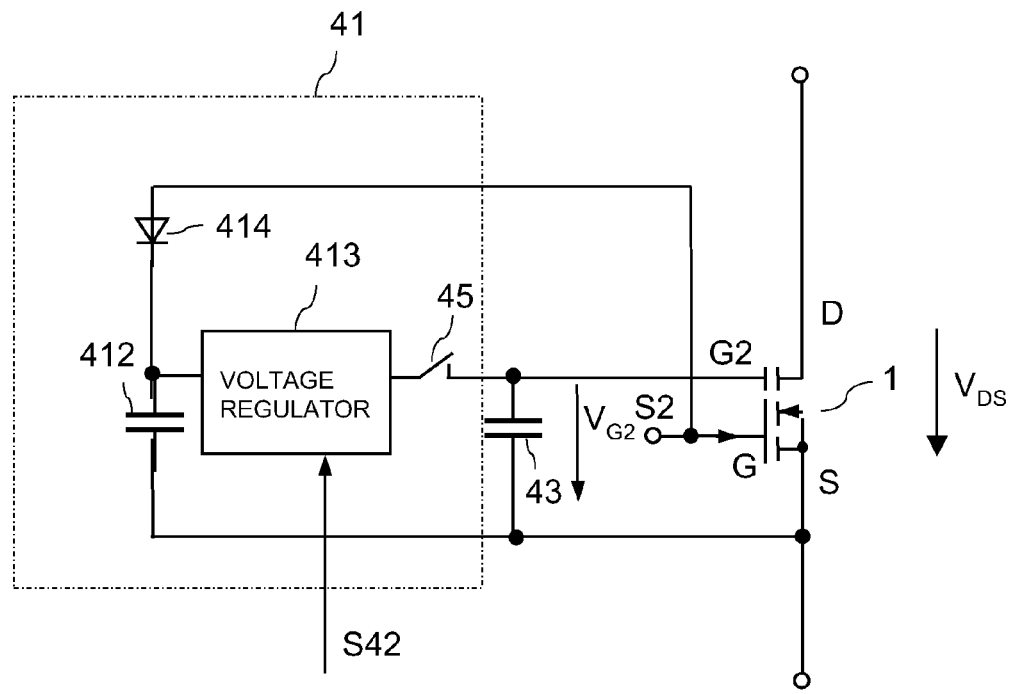
FIG. 13 illustrates a second embodiment of the drive potential generation circuit.

According to a further embodiment (not illustrated), the switching element 45 in the circuits of FIGS. 12 and 13 is replaced by a rectifying element, such as a diode. A resistor is connected in parallel with the drive capacitor 43, wherein the rectifying element is biased such that it allows the capacitor to be charged by the drive potential generation circuit 41. In this embodiment, the drive signal generation circuit 41 provides the drive potential during the on-state of the transistor 1, when the voltage across the capacitor is lower compared with the voltage in the off-state. The capacitor is slightly discharged by the resistor during on- and off-state and is automatically charged during the on-state when the potential of at the output of the drive potential generation circuit voltage regulator is higher than the potential of the drive capacitor 43 in on-state, but lower than the potential of the drive capacitor 43 in off-state.

According to a further embodiment illustrated in FIG. 13, the input capacitor 412 is charged via a rectifier element 414, like a diode, from the gate terminal G of the transistor 1. Each time when the transistor 1 is switched on the electrical potential of this terminal significantly increases above the source terminal S and charges the input capacitor 412 up to the gate potential. The rectifier element 414 prevents the input capacitor 412 from being discharged when the transistor 1 is switched off.

Figure 14:
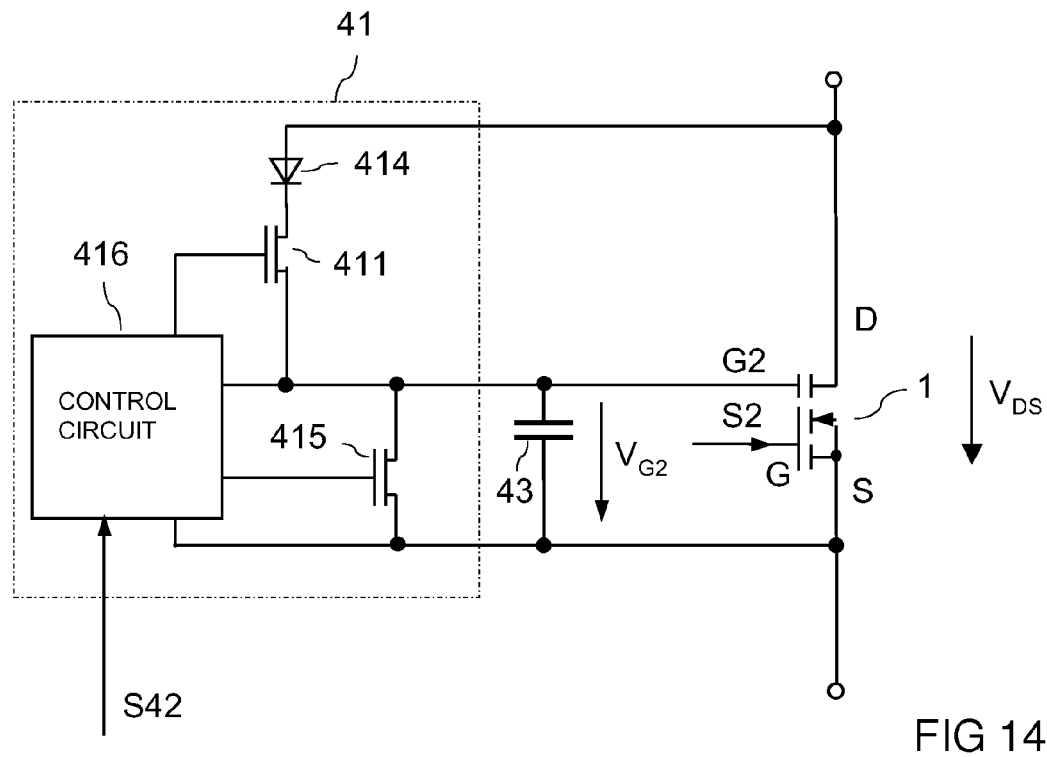
FIG. 14 illustrates a third embodiment of the drive potential generation circuit.

According to a further embodiment illustrated in FIG. 14, the drive potential generation unit 41 includes the drive capacitor 43, and a first transistor 411 connected between the drive capacitor 43 and a supply terminal, like the drain terminal D. Optionally, a diode is connected in series with the first transistor 411. A second transistor 415 is connected in parallel with the drive capacitor 43. A control circuit senses the voltage $V_{G2}$ across the drive capacitor 43 and adjusts this voltage $V_{G2}$ dependent on the adjustment signal S42 by driving the first and second transistor 411, 415. The voltage across the drive capacitor decreases, when the control circuit switches on the second transistor 415, and increases, when the control circuit switches on the first transistor 411. By switching both transistors 411, 415 off the output impedance of this drive signal generation circuit can be set to a high value. The first and second transistors 411, 415 can be either depletion or enhancement transistors.

The second transistor 415 could be replaced by a passive component, like a resistor, or by another active component, like a controllable Avalanche or Zener diode. A controllable Avalanche or Zener diode has an adjustable breakthrough voltage which, in the embodiment of FIG. 14, can be controlled by the control circuit. This Zener diode discharges the capacitor 43 to a voltage value corresponding to its breakthrough voltage.

Figure 15:
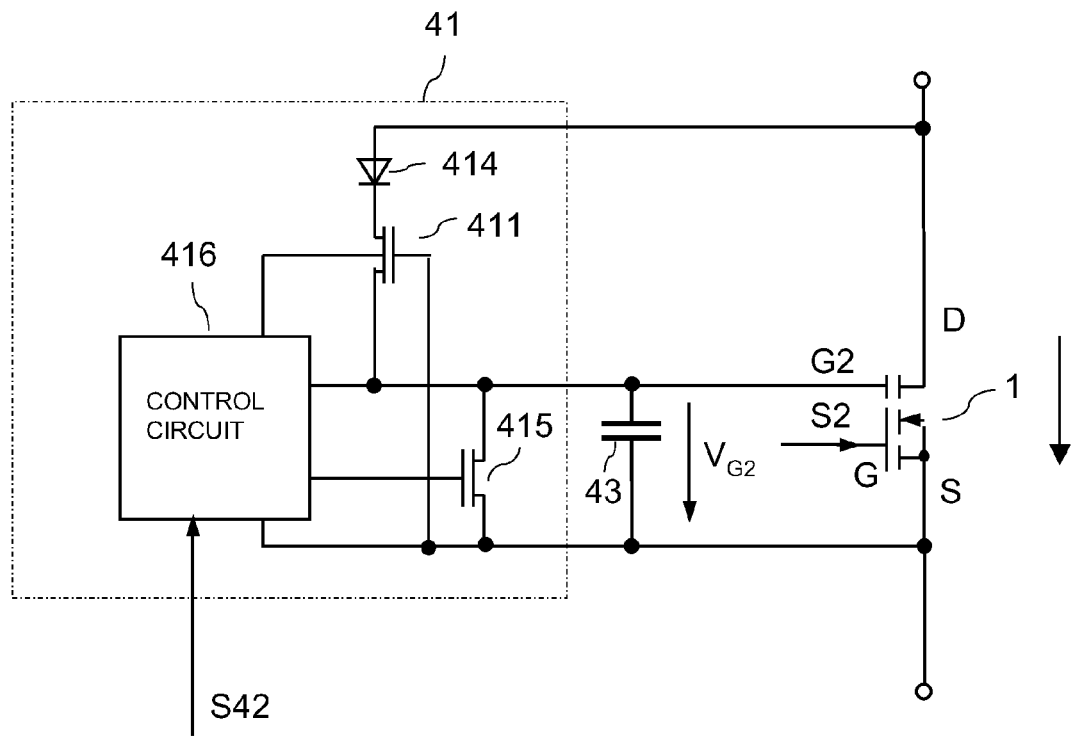
FIG. 15 illustrates a fourth embodiment of the drive potential generation circuit.

According to a further embodiment which is illustrated in FIG. 15, the first transistor 411 is a depletion transistor which has its gate terminal connected to reference potential, like source potential. The first transistor 411 further includes a substrate terminal via which the pinch-off voltage of the depletion transistor can be adjusted. The control circuit 416 is connected to this substrate terminal and is configured to adjust the pinch-off voltage dependent on the adjustment signal S42. In this circuit, the first transistor automatically charges the drive capacitor 43 to a voltage which corresponds to the pinch-off voltage. To decrease the voltage across the capacitor the second transistor 415 or, like in the embodiment of FIG. 14, a resistor or a controllable Zener diode can be provided.

In embodiments of the present invention, the energy stored in the output capacitance can be varied in a range of 10%, 20%, or even 50% by suitably adjusting the drive potential. In some types of transistors, this variation corresponds to a variation of the $V_{DS0}$ voltage in a range between 5V and 50V.

The drive circuit 40 can be implemented in the same chip or the same housing as the transistor 1. However, it is also possible to arrange parts of the drive circuit 40 in the same chip or the same housing as the transistor 1, while other parts are implemented in a separate chip or a separate housing. According to one embodiment, the load condition detection circuit (42 in FIG. 7) which generates the adjustment signal S42 is implemented in a chip or housing which separate to the chip or housing of the transistor 1, while the other parts, like the drive potential generation unit 41 are implemented in the same chip or housing as the transistor. The adjustment signal S42 can be any kind of signal which is suitable for transmitting the information on the desired drive potential $V_{G2}$ to the drive potential generation circuit 41, like a voltage signal, a current signal, an analog signal, a digital signal, a frequency signal, a PWM signal, etc. The drive potential generation circuit 41 is configured to receive (and demodulate) this signal and to generate the drive potential $V_{G2}$ dependent on this signal.

Referring to the explanation provided hereinbefore, the drive potential $V_{G2}$ or, more precisely, the internal potential of the drive potential generation unit 41 which is applied to the control terminal G2 during the complete switching cycle, during the on-state or the off-state, or only during parts of the on-state or the off-state, can vary slowly relative to variations of the gate drive signal, wherein the gate drive signal switches the transistor 1 on and off. According to one embodiment, a variation frequency $f_{G2}$ of the drive potential $V_{G2}$ is less than a variation frequency (switching frequency) $f_G$ at the gate terminal. According to one embodiment, the frequency of the drive potential $V_{G2}$ is less than 0.1 ($10^{-1}$) times the switching frequency $f_G$, or even less than 0.001 ($10^{-3}$) times the switching frequency $f_G$. In a PFC circuit arrangement, for example, the drive potential $V_{G2}$ can be configured to follow the power line current amplitude with double the power line frequency, e.g., 100 or 120 Hz, while the switching frequency is significantly higher.

Although embodiments of the present invention have been described in connection with specific transistors illustrated in FIGS. 3 and 5, it should be noted that the invention is not restricted to these specific types of transistors. For example, the invention could also be applied in connection with superjunction transistors. A superjunction transistor includes a drift zone of a first doping type and a compensation or drift control zone of a complementary second doping type, wherein a pn-junction is formed between the drift region and the compensation region. In case this type of transistor is used, the control terminal is connected to the compensation region.

Finally it should be mentioned that features explained in connection with one embodiment can, of course, be combined with features of other embodiments, even when this has not explicitly been mentioned before.

What is claimed is:

1. A circuit arrangement, comprising:
   a transistor with a gate terminal, a control terminal separate from the gate terminal, and a load path between a source terminal and a drain terminal, the transistor comprising an output capacitance with an output capacitance value that is dependent on a voltage across the load path of the transistor; and
   a drive circuit coupled to the control terminal and configured to
      determine a load condition of the transistor,
      provide a drive potential to the control terminal, and
      adjust the drive potential dependent on the load condition, wherein a characteristic of the capacitance value vs. the voltage across the load path is adjustable by the drive potential.

2. The circuit arrangement of claim 1,
   wherein the load condition is dependent on a current flowing through the load path, and
   wherein the drive circuit is configured to determine a current flowing through the load path, and to adjust the drive potential dependent on the determined current.

3. The circuit arrangement of claim 2, wherein the drive circuit is configured to determine a mean value or rms value of the current flowing through the load path within a given time period, and to adjust the drive potential dependent on the determined mean value.

4. The circuit arrangement of claim 2,
   wherein the transistor can assume an on-state, and
   wherein the drive circuit is configured to determine a current flowing through the load path in the on-state, and to adjust the drive potential dependent on the determined current.

5. The circuit arrangement of claim 2, wherein the drive circuit is configured to adjust the drive potential such that an absolute value of the drive potential increases when the current within a given current range increases.

6. The circuit arrangement of claim 1,
   wherein the transistor is configured to be switched on and off during one switching cycle, and
   wherein the drive circuit is configured the adjust the drive potential within the one switching cycle of the transistor only during a time period which is shorter than a time period of the one switching cycle.

7. The circuit arrangement of claim 6, wherein the drive circuit is configured to adjust the drive potential only during an on-state or only during an off-state of the transistor.

8. The circuit arrangement of claim 1,
   wherein the transistor is configured to be cyclically switched on and off,
   wherein the load condition is dependent on a switching frequency of cyclically switching on and off the transistor, and
   wherein the drive circuit is configured to adjust the drive potential dependent on the switching frequency.

9. The circuit arrangement of claim 1, wherein the drive circuit comprises:
   a load condition evaluation unit configured to determine the load condition of the transistor, and to provide an adjustment signal dependent on the load condition; and
   a drive potential generation circuit configured to receive the adjustment signal and to provide the drive potential dependent on the adjustment signal.

10. The circuit arrangement of claim 9, wherein the drive potential generation circuit comprises:
    an input terminal for receiving an input voltage;
    an output terminal for providing the drive potential; and
    a voltage controller connected between the input terminal and the output terminal, and configured to receive the adjustment signal and to provide the drive potential dependent on the adjustment signal.

11. The circuit arrangement of claim 9, wherein the load condition evaluation unit comprises:
    a current sensor configured to sense a current through the load path of the transistor, and to provide a current sense signal; and
    an evaluation unit configured to receive the current sense signal and to generate the adjustment signal dependent on the current sense signal.

12. The circuit arrangement of claim 1, wherein the transistor comprises:
    a source region connected to the source terminal, a drain region connected to the drain terminal, a drift region and a body region, wherein the body region is arranged between the source region and the drift region and the drift region is arranged between the body region and the drain region;

a gate electrode connected to the gate terminal and arranged adjacent to the body region, and a gate dielectric arranged between the gate electrode and the body region; and a drift control region coupled to the control terminal and arranged adjacent to the drift region.

13. The circuit arrangement of claim 12, further comprising a drift control region dielectric arranged between the drift control region and the drift region.

14. The circuit arrangement of claim 12, wherein the drift region and the drift control region comprise a monocrystalline semiconductor material.

15. The circuit arrangement of claim 12, wherein the drift control region is coupled to the drain region via a rectifier element.

16. The circuit arrangement of claim 1, wherein the transistor comprises:

a source region connected to the source terminal, a drain region connected to the drain terminal, a drift region and a body region, wherein the body region is arranged between the source region and the drift region and the drift region is arranged between the body region and the drain region;

a gate electrode connected to the gate terminal and arranged adjacent to the body region, and a gate dielectric arranged between the gate electrode and the body region; and a field electrode coupled to the control terminal and arranged adjacent to the drift region, and a field electrode dielectric arranged between a drift control region and the drift region.

17. The circuit arrangement of claim 1, wherein the transistor includes a drift region, and wherein the control terminal is configured to control a conducting channel in the drift region.

18. The circuit arrangement of claim 1, wherein:

the load path comprises a drift region between a body region and the drain terminal, the gate terminal is coupled to a gate electrode that is dielectrically insulated from the body region and is configured to control a conducting channel in the body region between a source region and the drift region, the control terminal is coupled either to one of a field electrode and a drift control region adjacent the drift region and is dielectrically insulated from the drift region by a dielectric, or to a compensation region forming a pn junction with the drift region.

19. A method of driving a transistor with a gate terminal, a control terminal separate from the gate terminal, and a load path between a source terminal and a drain terminal, the method comprising:

evaluating a load condition of the transistor;

applying a drive potential to the control terminal; and adjusting the drive potential dependent on the load condition, wherein the transistor comprises an output capacitance with an output capacitance value that is dependent on a voltage across the load path of the transistor, and a characteristic of the capacitance value vs. the voltage across the load path is adjustable by the drive potential.

20. The method of claim 19, wherein the load condition is dependent on a current flowing through the load path, and wherein the method further comprises:

determining a current flowing through the load path; and adjusting the drive potential dependent on the determined current.

21. The method of claim 20, further comprising:

determining a mean value of the current flowing through the load path within a given time period; and adjusting the drive potential dependent on the determined mean value.

22. The method of claim 20, wherein the method further comprises:

determining the current flowing through the load path while the transistor is in in an on-state; and adjusting the drive potential dependent on the current in the on-state.

23. The method of claim 20, further comprising:

adjusting the drive potential such that an absolute value of the drive potential increases when the current increases within a given current range.

24. The method of claim 19, wherein the transistor comprises:

a source region connected to the source terminal, a drain region connected to the drain terminal, a drift region and a body region, wherein the body region is arranged between the source region and the drift region and the drift region is arranged between the body region and the drain region;

a gate electrode connected to the gate terminal and arranged adjacent to the body region, and a gate dielectric arranged between the gate electrode and the body region; and a drift control region coupled to the control terminal and arranged adjacent to the drift region.

25. The method of claim 24, wherein the transistor includes a drift control region dielectric arranged between the drift control region and the drift region.

26. The method of claim 24, wherein the drift region and the drift control region include a monocrystalline semiconductor material.

27. The method of claim 24, wherein the drift region is coupled to the drain region via a rectifier element.

28. The method of claim 19, wherein the transistor comprises:

a source region connected to the source terminal, a drain region connected to the drain terminal, a drift region and a body region, wherein the body region is arranged between the source region and the drift region and the drift region is arranged between the body region and the drain region;

a gate electrode connected to the gate terminal and arranged adjacent to the body region, and a gate dielectric arranged between the gate electrode and the body region; and a field electrode coupled to the control terminal and arranged adjacent to the drift region, and a field electrode dielectric arranged between a drift control region and the drift region.

29. The method of claim 19, wherein:

the load path comprises a drift region between a body region and the drain terminal, the gate terminal is coupled to a gate electrode that is dielectrically insulated from the body region and is configured to control a conducting channel in the body region between a source region and the drift region, the control terminal is coupled either to one of a field electrode and a drift control region adjacent the drift region and is dielectrically insulated from the drift region by a dielectric, or to a compensation region forming a pn junction with the drift region.

30. An integrated circuit for driving a transistor with a gate terminal, a control terminal separate from the gate terminal, and a load path between a source terminal and a drain terminal, the transistor comprising an output capacitance with an output capacitance value that is dependent on a voltage across the load path of the transistor, the integrated circuit comprising:
- a load condition evaluation unit configured to evaluate a load condition of the transistor; and
- a drive potential generation circuit configured to apply a drive potential to the control terminal, wherein the drive potential generation circuit is configured to adjust the drive potential dependent on the load condition, wherein a characteristic of the capacitance value vs. the voltage across the load path is adjustable by the drive potential.

31. The integrated circuit of claim 30, wherein the drive potential generation circuit comprises a voltage regulator having a supply terminal configured to be coupled to the drain terminal of the transistor via a diode device.

32. The integrated circuit of claim 30, wherein the drive potential generation circuit comprises a voltage regulator having a supply terminal configured to be coupled to the gate terminal of the transistor via a diode device.

33. The integrated circuit of claim 30, wherein the drive potential generation circuit comprises a control circuit configured to be coupled to the drain terminal of the transistor via a diode in series with a first transistor, the first transistor having a gate coupled to the control circuit.

34. The integrated circuit of claim 30, wherein the drive potential generation circuit comprises a control circuit configured to be coupled to the drain terminal of the transistor via a diode in series with a first transistor, the first transistor having a gate coupled to a reference voltage node.

35. The integrated circuit of claim 30, wherein:
- the load path comprises a drift region between a body region and the drain terminal,
- the gate terminal is coupled to a gate electrode that is dielectrically insulated from the body region and is configured to control a conducting channel in the body region between a source region and the drift region,
- the control terminal is coupled either to one of a field electrode and a drift control region adjacent the drift region and is dielectrically insulated from the drift region by a dielectric, or to a compensation region forming a pn junction with the drift region.

36. A circuit arrangement, comprising:
- a transistor component with a gate terminal, a control terminal, and a load path between a source terminal and a drain terminal; and
- a drive circuit coupled to the control terminal and configured to determine a load condition of the transistor component, to provide a drive potential to the control terminal, and to adjust the drive potential dependent on the load condition, wherein
- the transistor component is configured to be switched on and off during one switching cycle, and
- the drive circuit is configured the adjust the drive potential within the one switching cycle of the transistor component only during a time period which is shorter than a time period of the one switching cycle.

37. The circuit arrangement of claim 36, wherein the drive circuit is configured to adjust the drive potential only during an on-state or only during an off-state of the transistor component.

38. A circuit arrangement, comprising:
- a transistor with a gate terminal, a control terminal separate from the gate terminal, and a load path between a source terminal and a drain terminal, the transistor comprising an output capacitance with an output capacitance value that is dependent on a voltage across the load path of the transistor; and
- a drive circuit coupled to the control terminal and configured to
  - determine a current flowing though the load path,
  - provide a drive potential to the control terminal, and
  - adjust the drive potential to decrease the output capacitance value when the determined current decreases within a first range.

39. The circuit arrangement of claim 38, wherein:
- the load path comprises a drift region between a body region and the drain terminal,
- the gate terminal is coupled to a gate electrode that is dielectrically insulated from the body region and is configured to control a conducting channel in the body region between a source region and the drift region,
- the control terminal is coupled either to one of a field electrode and a drift control region adjacent the drift region and is dielectrically insulated from the drift region by a dielectric, or to a compensation region forming a pn junction with the drift region.

* * * * *

UNITED STATES PATENT AND TRADEMARK OFFICE
CERTIFICATE OF CORRECTION

| | | |
|---|---|---|
| PATENT NO. | : 8,674,727 B2 | Page 1 of 1 |
| APPLICATION NO. | : 12/873146 | |
| DATED | : March 18, 2014 | |
| INVENTOR(S) | : Anton Mauder et al. | |

It is certified that error appears in the above-identified patent and that said Letters Patent is hereby corrected as shown below:

In the Claims

In Col. 18, line 20, claim 6, delete "the adjust" and insert --to adjust--.
In Col. 20, line 9, claim 22, delete "in in" and insert --in--.
In Col. 22, line 12, claim 36, delete "the adjust" and insert --to adjust--.

Signed and Sealed this
Twelfth Day of August, 2014

Michelle K. Lee
*Deputy Director of the United States Patent and Trademark Office*